(12) United States Patent
Chen et al.

(10) Patent No.: US 8,379,388 B2
(45) Date of Patent: Feb. 19, 2013

(54) SERVER

(75) Inventors: Yi-Hsuan Chen, Taipei (TW); Chi-Hua Yeh, Taipei (TW); De-Yang Wu, Taipei (TW); Ting-Kai Chen, Taipei (TW); Chin-Yuan Li, Taipei (TW); Chih-Han Kuo, Taipei (TW)

(73) Assignee: Inventec Corporation, Taipei (TW)

( * ) Notice: Subject to any disclaimer, the term of this patent is extended or adjusted under 35 U.S.C. 154(b) by 197 days.

(21) Appl. No.: 13/037,368

(22) Filed: Mar. 1, 2011

(65) Prior Publication Data

US 2012/0120602 A1    May 17, 2012

(30) Foreign Application Priority Data

Nov. 11, 2010  (TW) ............................... 99138883 A

(51) Int. Cl.
*H05K 7/20* (2006.01)
*H02B 1/20* (2006.01)

(52) U.S. Cl. ............. 361/695; 361/679.33; 361/679.48; 361/679.5; 361/692; 361/725; 361/826; 165/121; 165/122; 165/126; 165/104.33; 165/185; 454/184; 312/223.2; 312/236; 312/223.6; 312/330.1; 174/50; 174/60; 174/99 R; 174/168; 174/520

(58) Field of Classification Search ............. 361/679.01, 361/679.33, 679.46–679.5, 690–697, 715, 361/724–727, 826; 165/80.3, 121–126, 104.33, 165/185; 174/50, 54, 59, 60, 70 R, 71, 71 R, 174/72 A, 72 R, 168, 173, 99 R, 17 R, 520; 312/223.2, 223.6, 236, 330.1, 334.1, 334.5, 312/334.7, 334.8, 265.1–265.4; 454/184

See application file for complete search history.

(56) References Cited

U.S. PATENT DOCUMENTS

| | | | |
|---|---|---|---|
| 6,459,571 B1 * | 10/2002 | Carteau | 361/679.33 |
| 6,544,057 B1 * | 4/2003 | Stremick et al. | 439/162 |
| 6,574,100 B1 * | 6/2003 | Anderson | 361/679.5 |
| 6,590,768 B1 * | 7/2003 | Wiley | 361/690 |
| 6,796,437 B2 * | 9/2004 | Krampotich et al. | 211/26 |
| 7,359,218 B2 * | 4/2008 | McGrew | 361/826 |
| 7,718,891 B2 * | 5/2010 | Adducci et al. | 174/50 |
| 8,130,494 B2 * | 3/2012 | Larsen et al. | 361/690 |
| 8,132,874 B2 * | 3/2012 | Ong et al. | 312/334.4 |
| 8,273,989 B2 * | 9/2012 | Garza et al. | 174/100 |
| 2012/0020006 A1 * | 1/2012 | Xu et al. | 361/679.33 |
| 2012/0212909 A1 * | 8/2012 | Jeffery et al. | 361/724 |

* cited by examiner

*Primary Examiner* — Michail V Datskovskiy
(74) *Attorney, Agent, or Firm* — Jianq Chyun IP Office

(57) ABSTRACT

A server including a rack, at least one chassis, a plurality of electronic modules, and a cable module is provided. The rack has an opening. The chassis is movably disposed in the rack along a first axis, and moves in and out the rack through the opening. The electronic modules are vertically and detachably disposed in the chassis. A plurality of channels parallel to a second axis and each of the channels is disposed between two adjacent electronic modules, and the first axis is perpendicular to the second axis. The cable module is disposed at a side of the chassis. The cable module is connected to at least one of the electronic modules. When the chassis is moved out from the rack, the electronic module connected to the cable module is next to the opening of the rack.

7 Claims, 4 Drawing Sheets

SERVER

CROSS-REFERENCE TO RELATED APPLICATION

This application claims the priority benefit of Taiwan application serial no. 99138883, filed on Nov. 11, 2010. The entirety of the above-mentioned patent application is hereby incorporated by reference herein and made a part of this specification.

BACKGROUND OF THE INVENTION

1. Field of the Invention

The present invention generally relates to a server, and in particular, to a server with a configuration structure beneficial to heat-dissipation.

2. Description of Related Art

A server is a core computer providing services for various computers in a network system, which provides functions such as a magnetic disk or printing service for network users, and meanwhile, enables clients to share various resources in the network environment. A basic architecture of the server is approximately the same as an ordinary personal computer, which includes a Central Processing Unit (CPU), a memory, and an Input/Output (I/O) device. These components are connected through a bus, the CPU and the memory are connected through a north bridge chip, and the I/O device is connected through a south bridge chip.

A rack server is taken as an example herein. The rack server is a server with the exterior designed according to a unified standard, and is used in coordination with a machine cabinet. Many professional network devices use a rack structure, which are mainly flat like a drawer, for example, the switch, router or hardware firewall. The width of the rack server is 19 inches, and the height is in a unit of U (1 U=1.75 inches=44.45 millimetres). Normally, the standard servers include 1 U, 2 U, 3 U, 4 U, 5 U, and 7 U servers.

However, since electronic modules and heat-dissipation devices almost occupy all space in a chassis of the rack server, the heat-dissipation of this kind of server is restricted to a certain extent. For example, a fan of the rack server in the prior art is mostly disposed on a back panel of the chassis, and therefore the air flowing direction in the chassis is the same as the chassis moving direction. Generally, since the chassis mostly has an exterior design with a long distance between the front and back sides and a short distance between left and right sides, the heat-dissipation effect is lowered due to a long flowing route of the air flow in the chassis.

Moreover, cables of the current server extend out from the chassis after being connected to the electronic modules in the chassis. When the electronic modules are disposed at improper positions in the chassis, the extension part of the cables will project in the front of the chassis, resulting in troubles in replacing or repairing the electronic modules in the chassis for the users.

SUMMARY OF THE INVENTION

Accordingly, the present invention is directed to a server, which has a better configuration structure.

An embodiment of the present invention provides a server, which includes a rack, at least one chassis, a plurality of electronic modules and a cable module. The rack has an opening. The chassis is movably disposed in the rack along a first axis, and is moved out or moved in the rack through the opening. The electronic modules are vertically and detachably disposed in the rack, a plurality of channels are parallel to a second axis and each of the channels is disposed between two adjacent the electronic modules, and the first axis is perpendicular to the second axis. The cable module is disposed on a side of the chassis, and is connected to at least one of the electronic modules. When the chassis is moved out from the rack, the electronic modules connected to the cable module are next to the opening.

According to an embodiment of the present invention, the chassis includes a front panel parallel to the second axis. When the chassis is moved into the rack, the front panel is located on the opening.

According to an embodiment of the present invention, the electronic modules include a plurality of circuit board modules and a plurality of power supply modules. The circuit board modules are inserted in the chassis, paralleled to the second axis and away from the front panel along the first axis, and at least one of the channels is located between the two adjacent circuit board modules. The power supply modules are inserted in the chassis, paralleled to the second axis and away from the front panel along the first axis, and at least one of the channels is located between the two adjacent power supply modules, and the circuit board modules are located between the front panel and the power supply modules.

According to an embodiment of the present invention, the electronic modules further include a plurality of storage modules, which are inserted in array in the chassis along the first axis and the second axis. The storage modules are located between the circuit board modules and the front panel, and at least one of the channels is located between two adjacent storage modules along the first axis.

According to an embodiment of the present invention, the cable module has a first end and a second end opposite to each other, in which, the first end is connected to the circuit board modules and the power supply modules, and the second end extends towards the front panel from the first end.

According to an embodiment of the present invention, the server further includes a fan module, disposed on a side of the rack and corresponding to the channels.

According to an embodiment of the present invention, the chassis has a plurality of air inlets and air outlets. The air inlets and the air outlets are oppositely located on two ends of the channels. An airflow generated by the fan module flows in or out the chassis through the air inlets and the air outlets.

Based on the above, according to the embodiments of the present invention, the electronic modules in the server are vertically inserted in the chassis, and channels perpendicular to the moving direction of the chassis are formed through such configuration of the components, so that the air flow in the chassis is transmitted along the channels, thus improving the heat-dispassion effect in the chassis.

Moreover, the electronic modules connected to the cable module in the chassis are away from the front panel of the chassis, that is, the electronic modules connected to the cable module are substantially next to the opening of the chassis when the chassis is pulled out from the rack. In this way, the cable module is enabled to extend towards the front panel along the chassis from the electronic modules in the chassis, and thus the cable module is still smoothly disposed on one side of the chassis after the chassis is pulled out by the user, thus avoiding the inconvenience for the user caused by the cables scattered in disorder in the front of the front panel of the chassis.

In order to make the aforementioned features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
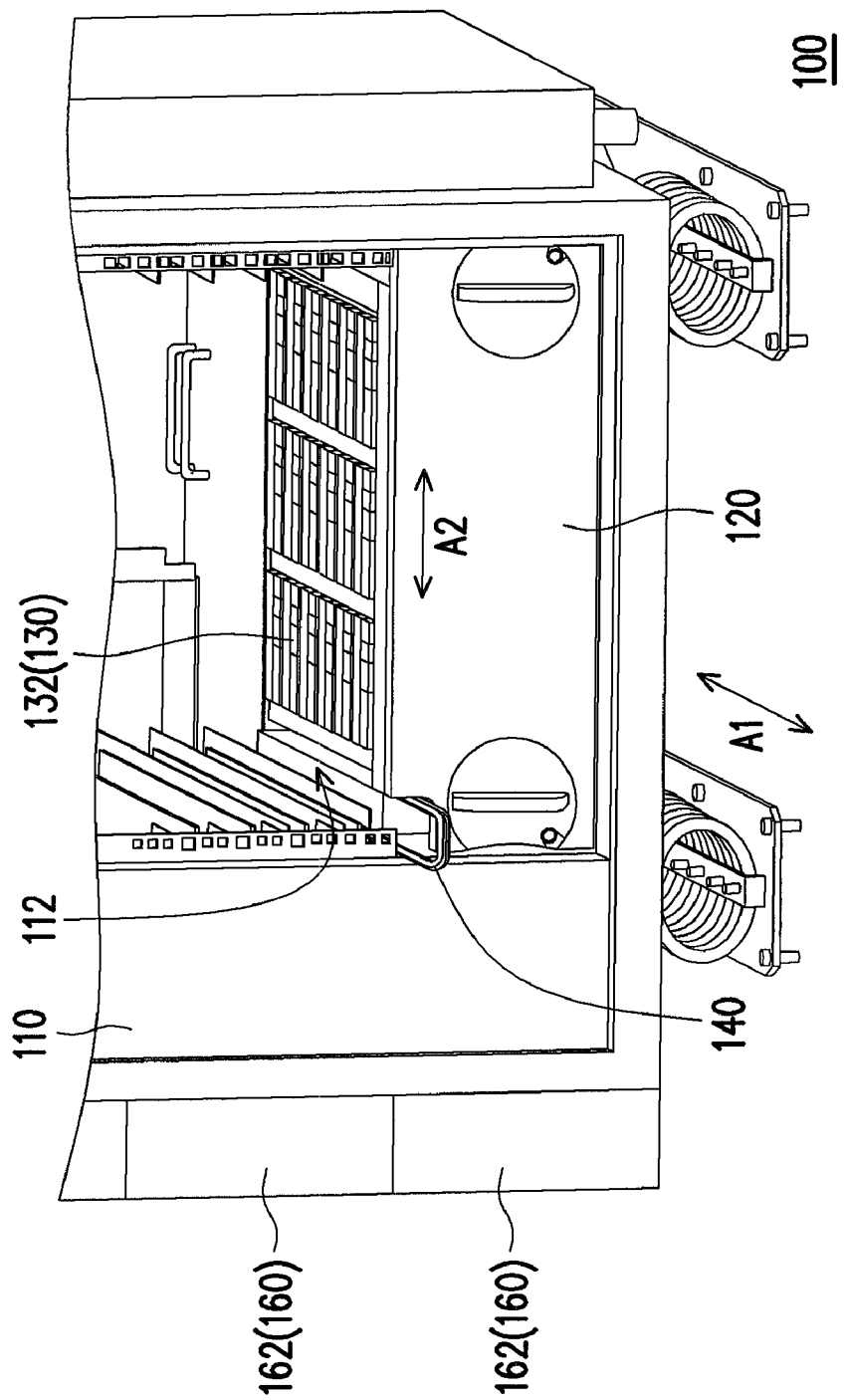
FIG. 1 and FIG. 2 are schematic views of a server in different states according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
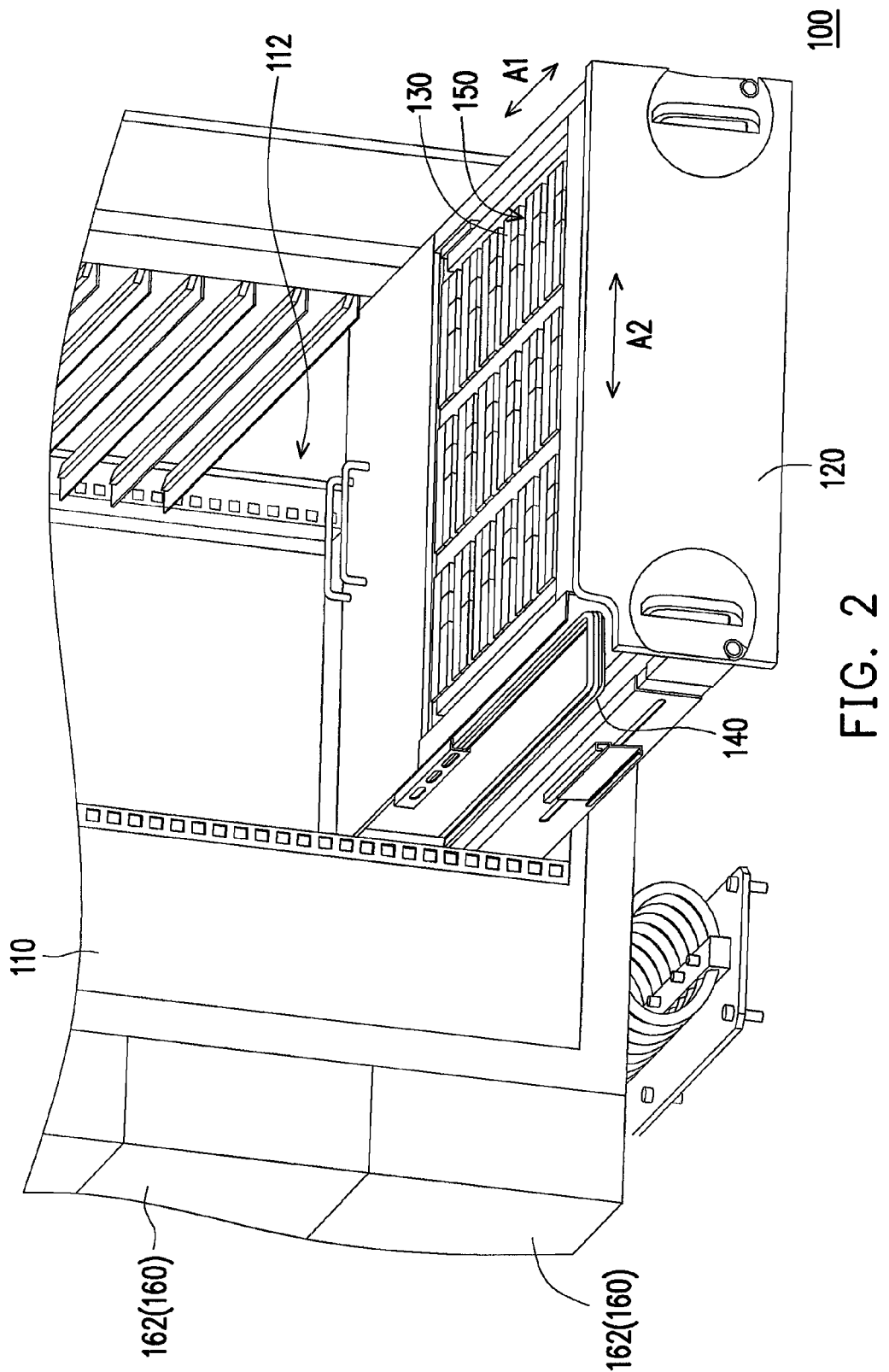

FIG. 1 and FIG. 2 are schematic views of a server in different states according to an embodiment of the present invention. Referring to FIG. 1 and FIG. 2, in this embodiment, a server 100, for example, is a rack server, and is applicable to an ordinary server product or a cloud computing server product. The server 100 includes a rack 110, at least one chassis 120, a plurality of electronic modules 130 disposed in the chassis 120, and a cable module 140. Here, the case of one chassis 120 is described in the following.

The rack 110 has an opening 112, the chassis 120 is movably disposed in the rack 110 along a first axis A1, and the chassis 120 is moved in or out the rack 120 through the opening 112. Moreover, the electronic modules 130 are vertically and detachably disposed in the chassis 120, in which, a plurality of channels 150 are parallel to a second axis A2 and each of the channels 150 is disposed between two adjacent electronic modules 130, and the first axis A1 is perpendicular to the second axis A2. In other words, when a user is in the front of the server 100, the chassis 120 may be pulled out or pushed in the rack 110 in a front-and-back direction, and the electronic modules 130 in the chassis 120 form channels 150 disposed in a left-and-right direction. The cable module 140 is disposed on a side of the chassis 120, and is connected to a part of the electronic modules 130. When the chassis 120 is moved out from the rack 110, the electronic modules 130 connected to the cable module 140 are substantially next to the opening 112 of the rack 110.

Based on the above, through the electronic modules 130 disposed in the chassis 120, the channels 150 parallel to the second axis A2 are formed in the chassis 120 so as to benefit the heat-dispassion, and the cable module 140 is limited so that the cable module 140 is smoothly disposed on a side of the chassis 120. Thus, the cable module 140 will not be exposed in disorder in the front of the chassis 120 when the chassis 120 is pulled out from the rack 110. Therefore, the configuration of the present invention enables the server 100 to have a compact exterior and better operability.

Figure 3:
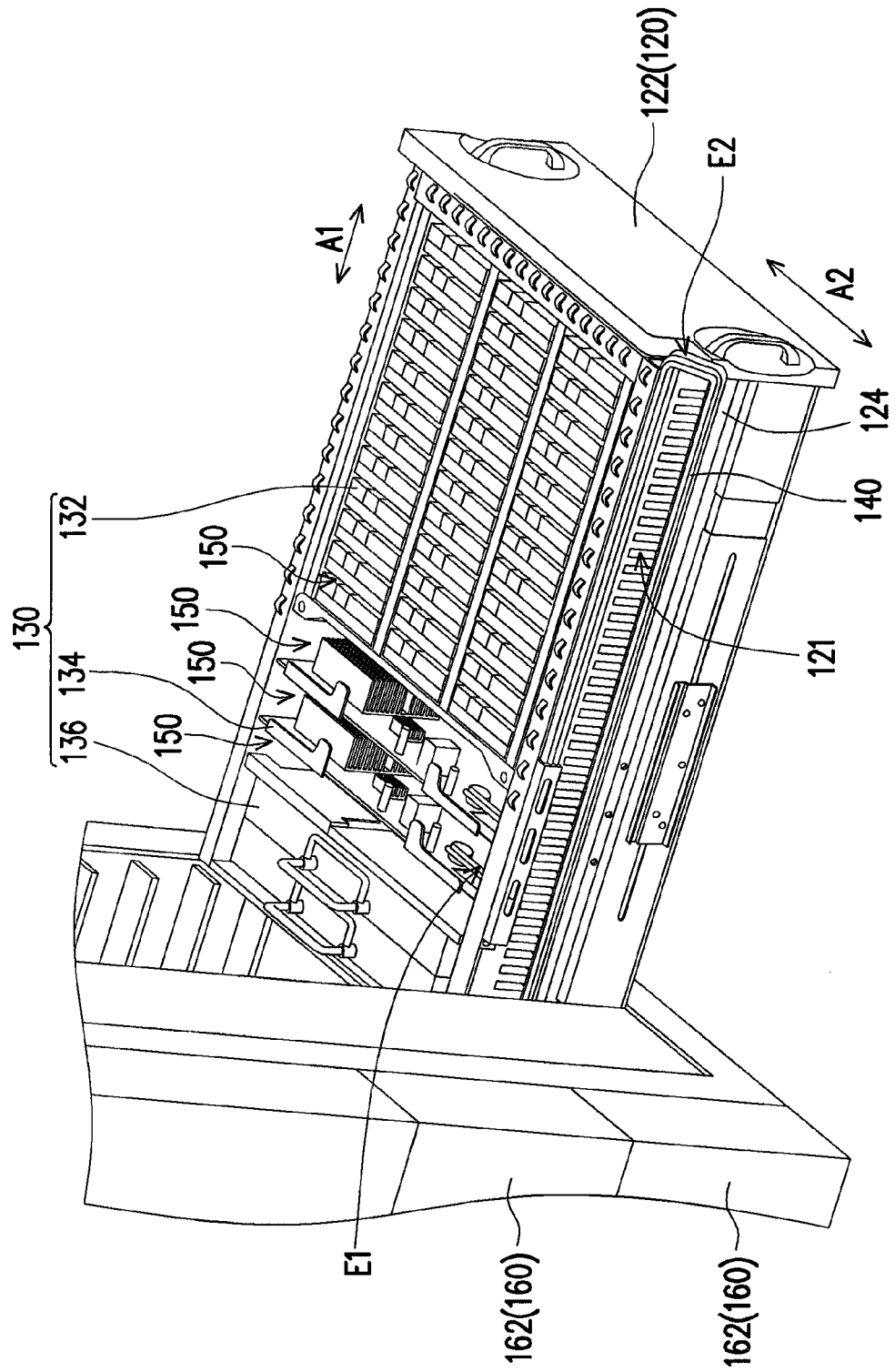
FIG. 3 and FIG. 4 show a chassis of the server in FIG. 1 and FIG. 2 from different view points.
Figure 4:
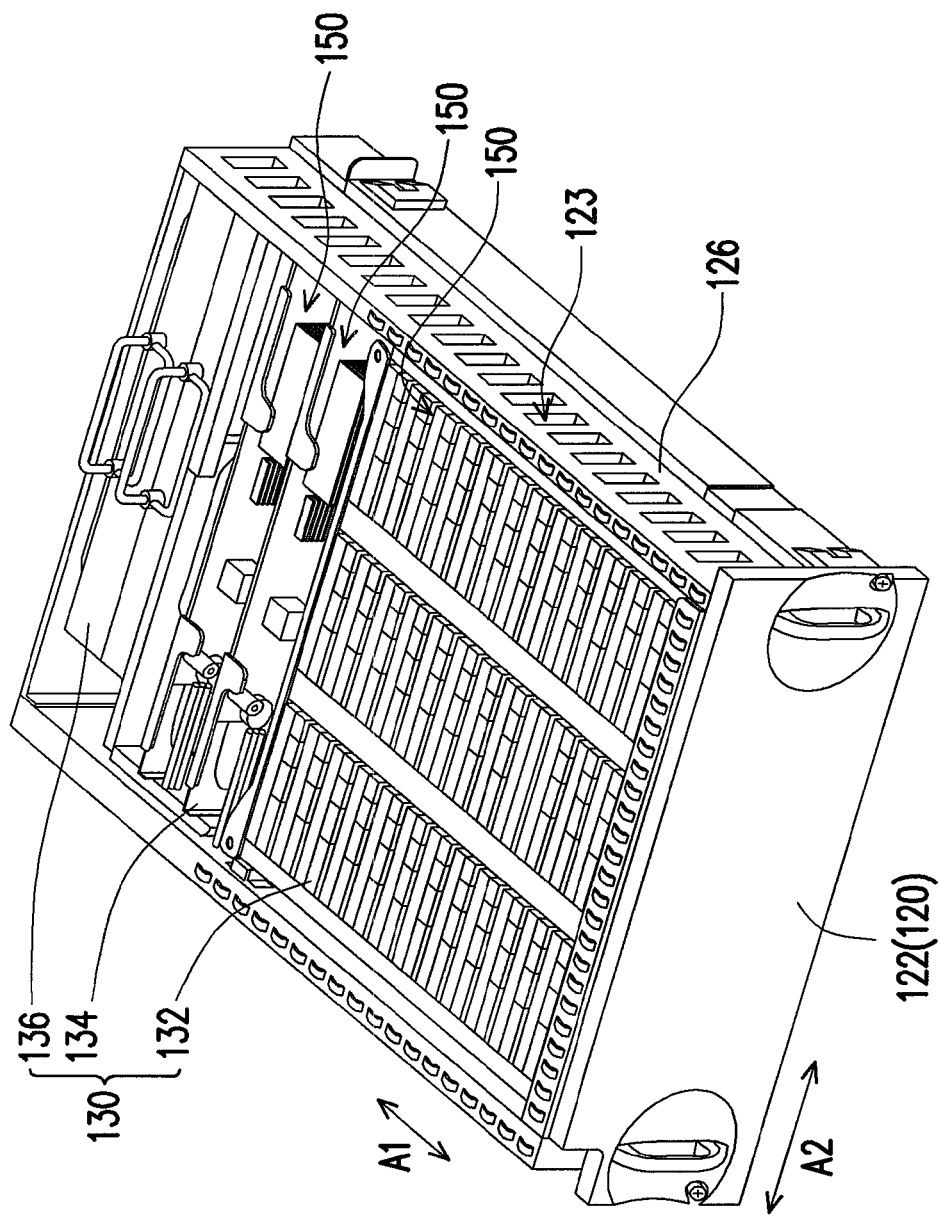

FIG. 3 and FIG. 4 show a chassis of the server in FIG. 1 and FIG. 2 from different view points. Referring to FIGS. 1 to 4, specifically, the chassis 120 has a front panel 122 parallel to the second axis A2, and the front panel 122 is substantially located at the opening 112 of the rack 110 when the chassis 120 is moved into the rack 110 (as shown in FIG. 1). The electronic modules 130 include a plurality of storage modules 132, two circuit board modules 134 paralleled to the second axis A2 and away from the front panel 122, and two power supply modules 136 paralleled to the second axis A2 and away from the front panel 122. It should be noted that, the two circuit board modules 134 and the two power supply modules 136 in this embodiment are used so that the electronic modules 130 can be replaced or repaired without powering off the server 100. In this embodiment, the number of the electronic modules 130 is not limited, and any structure configuration in the chassis 120 in which the electronic modules 130 in the server 100 can be replaced or repaired without powering off the server 100 is all applicable to this embodiment.

The storage modules 132, such as a hard disk, are inserted in array in the chassis 120 along the first axis A1 and the second axis A2. Moreover, the circuit board modules 134, such as an I/O circuit board, are vertically inserted on a mainboard module (not shown) in the chassis 120 respectively, and the storage modules 132 are located between the circuit board modules 134 and the front panel 122 of the chassis 120. The power supply modules 136 are used to provide power supply to the electronic modules 130 in the chassis 120. Like the storage modules 132 and the circuit board modules 134, the power supply modules 136 are vertically inserted in the chassis 120 and are connected to the mainboard module respectively, and the storage modules 132 and the circuit board modules 134 are located between the power supply modules 136 and the front panel 122 of the chassis 120. Moreover, the power supply modules 136 may also include a backup battery (not shown) which is used as a backup power supply during the replacement and repair of the electronic modules 130. In this embodiment, the internal configuration structure of the chassis 120 is substantially as follows: the storage modules 132, the circuit board modules 134 and the power supply modules 136 are disposed towards the interior of the chassis 120 from the front panel 122 of the chassis 120.

In addition, a first end E1 and a second end E2 which are opposite to each other are disposed in the cable module 140 of the chassis 120, in which, the first end E1 for example is connected to the circuit board modules 134 and the power supply modules 136 through a connector (not shown), and the second end E2 extends towards the front panel 122 along a side board 124 of the chassis 120 from the first end E1, and is connected to a periphery of the rack 110 (such as a hub, not shown). It should be noted that, when the chassis 120 is moved into the rack 110, a part of the cable module 140 is exposed out of the rack 110 and has a distance from the opening 112. When the chassis 120 is moved out from the rack 110, the cable module 140 is still located on the side board 124 of the chassis 120, and does not project in the front of the front panel 122 with the movement of the chassis 120.

Briefly, since the length of the cable module 140 is fixed, the circuit board modules 134 and the power supply modules 136 connected to the cable module 140 are disposed in the innermost of the chassis 120 (that is, relatively far away from the front panel 122 of the chassis 120), so that the cable module 140 is limited on the side board 124 of the chassis 120. No matter the chassis 120 is in a state of being moved in or moved out the rack 110, the location change of the chassis 120 relative to the rack 110 has no effect on the cable module 140, thus avoiding the inconvenience caused by the cable module 140 exposed in the front of the chassis 120 for the user.

In another aspect, the channels 150 are formed respectively between any two adjacent storage modules 132 along the first axis A1, between two adjacent circuit board modules 134 and between the two adjacent power supply modules 136 through the configuration structure of the storage modules 132, the circuit board modules 134 and the power supply modules 136 vertically inserted in the chassis 120. Moreover, the chassis 120 further includes a plurality of air inlets 121 and a plurality of air outlets 123, which are located on the two side boards 124 and 126 of the chassis 120. The air inlets 121 and air outlets 123 are oppositely located on the two ends of the channels 150. In addition, referring to FIG. 1 and FIG. 2 again, the server 100 further includes a fan module 160, which is disposed on a side of the rack 110, and for example is formed by a plurality of replaceable fan units 162 in stacks. The fan module 160 is used to generate an air flow, and the air flow flows in or flows out the chassis 120 substantially through the air inlets 121 and the air outlets 123. More importantly, the airflow flows along the channels 150 in the chassis 120, so that the flowing direction of the air flow is parallel to the second axis A2.

Accordingly, the air flow transmitted to the chassis 120 from the fan module 160 flows laterally along the channels 150 through the configuration structure of the electronic modules 130 in the chassis 120, thus improving the heat-dispassion effect of the fan module 160 on the electronic modules 130 in the chassis 120.

Based on the above, according to the embodiments of the present invention, the electronic modules in the server are vertically inserted in the chassis, and channels perpendicular to the moving direction of the chassis are formed through the configuration structure, so that the air flow in the chassis is transmitted along the channels, thus improving the heat-dispassion effect in the chassis.

Moreover, the electronic modules connected to the cable module in the chassis are away from the front panel of the chassis, that is, the electronic modules connected to the cable module are substantially next to the opening of the chassis when the chassis is pulled out from the rack. In this way, the cable module can extend towards the front panel along the chassis from the electronic modules in the chassis, and thus the cable module is still smoothly disposed on a side of the chassis after the chassis is pulled out by the user, thus avoiding the inconvenience caused by the cables scattered in disorder in the front of the front panel of the chassis for the user.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server, comprising:
    a rack comprising an opening;
    at least one chassis, movably disposed in the rack along a first axis, wherein the chassis is moved in or moved out the rack through the opening;
    a plurality of electronic modules, vertically and detachably disposed in the chassis, wherein a plurality of channels are parallel to a second axis and each of the channels is disposed between two adjacent electronic modules, and the first axis is perpendicular to the second axis; and
    a cable module, disposed on a side of the chassis, wherein the cable module is connected to at least one of the electronic modules, and the electronic module connected to the cable module is next to the opening when the chassis is moved out from the rack.

2. The server according to claim 1, wherein the chassis comprises a front panel parallel to the second axis, and the front panel is located at the opening when the chassis is moved into the rack.

3. The server according to claim 2, wherein the electronic modules comprise:
    a plurality of circuit board modules, inserted in the chassis, paralleled to the second axis and away from the front panel, wherein at least one of the channels is located between the two adjacent circuit board modules; and
    a plurality of power supply modules, inserted in the chassis, paralleled to the second axis and away from the front panel, wherein at least one of the channels is located between the two adjacent power supply modules, and the circuit board modules are located between the front panel and the power supply modules.

4. The server according to claim 3, wherein the electronic modules further comprise:
    a plurality of storage modules, inserted in array in the chassis along the first axis and the second axis, wherein the storage modules are located between the circuit board modules and the front panel, and at least one of the channels is located between two adjacent storage modules along the first axis.

5. The server according to claim 3, wherein the cable module comprises a first end and a second end opposite to each other, the first end is connected to the circuit board modules and the power supply modules, and the second end extends towards the front panel from the first end.

6. The server according to claim 1, further comprising:
    a fan module, disposed on a side of the rack and corresponding to the channels in the chassis.

7. The server according to claim 6, wherein the chassis comprises a plurality of air inlets and a plurality of air outlets, the air inlets and the air outlets are oppositely located on two ends of the channels, and an air flow generated by the fan module flows in or flows out from the chassis through the air inlets and the air outlets.

* * * * *